(12) United States Patent
Inoue et al.

(10) Patent No.: US 10,056,103 B2
(45) Date of Patent: Aug. 21, 2018

(54) METHOD OF MANUFACTURING MAGNETIC RECORDING MEDIUM, MAGNETIC RECORDING MEDIUM, AND MAGNETIC RECORDING AND REPRODUCING APPARATUS

(71) Applicant: SHOWA DENKO K.K., Minato-ku, Tokyo (JP)

(72) Inventors: Ken Inoue, Ichihara (JP); Gohei Kurokawa, Ichihara (JP); Haruhisa Ohashi, Ichihara (JP)

(73) Assignee: SHOWA DENKO K.K., Minato-ku, Tokyo (JP)

( * ) Notice: Subject to any disclaimer, the term of this patent is extended or adjusted under 35 U.S.C. 154(b) by 856 days.

(21) Appl. No.: 14/160,955

(22) Filed: Jan. 22, 2014

(65) Prior Publication Data

US 2014/0204484 A1    Jul. 24, 2014

(30) Foreign Application Priority Data

Jan. 23, 2013  (JP) .................. 2013-010088
Jan. 17, 2014  (JP) .................. 2014-007216

(51) Int. Cl.
*C23C 14/34*   (2006.01)
*G11B 5/851*   (2006.01)
(Continued)

(52) U.S. Cl.
CPC .......... *G11B 5/851* (2013.01); *C23C 14/0688* (2013.01); *C23C 14/08* (2013.01);
(Continued)

(58) Field of Classification Search
CPC ...... C23C 14/083; C23C 14/086; C23C 14/54
See application file for complete search history.

(56) References Cited

U.S. PATENT DOCUMENTS 6,670,056 B2   12/2003  Hikosaka
7,470,474 B2   12/2008  Sakawaki et al.
(Continued)

FOREIGN PATENT DOCUMENTS

CN    101606197 A    12/2009
CN    101836255 A    9/2010
(Continued)

OTHER PUBLICATIONS

Communication dated Apr. 6, 2016 issued by the United States Patent and Trademark Office in counterpart U.S. Appl. No. 14/446,450.

(Continued)

*Primary Examiner* — Jason Berman
(74) *Attorney, Agent, or Firm* — Sughrue Mion, PLLC

(57) ABSTRACT

A method of manufacturing a magnetic recording medium, includes at least: forming an orientation control layer 3 that controls orientation of an immediately above layer thereof on a non-magnetic substrate 1; and forming a perpendicular magnetic layer 4 in which an easy axis of magnetization is mainly perpendicularly orientated to the non-magnetic substrate 1, in which the forming of the orientation control layer 3 includes forming a granular layer having a granular structure that includes Ru or a material in which Ru is a main component and an oxide having a melting point which is greater than or equal to 450° C. and less than or equal to 1000° C., by a sputtering method, and the forming of the perpendicular magnetic layer 4 includes growing crystal grains to form columnar crystals that are continuous in a thickness direction together with crystal grains that form the orientation control layer 3.

9 Claims, 2 Drawing Sheets

(51) Int. Cl.
| | |
|---|---|
| *G11B 5/738* | (2006.01) |
| *C23C 14/08* | (2006.01) |
| *C23C 14/54* | (2006.01) |
| *G11B 5/73* | (2006.01) |
| *G11B 5/84* | (2006.01) |
| *C23C 14/06* | (2006.01) |
| *C23C 14/16* | (2006.01) |

(52) U.S. Cl.
CPC .......... *C23C 14/086* (2013.01); *C23C 14/165* (2013.01); *C23C 14/54* (2013.01); *G11B 5/738* (2013.01); *G11B 5/7325* (2013.01); *G11B 5/8404* (2013.01)

(56) References Cited

U.S. PATENT DOCUMENTS

| | | | |
|---|---|---|---|
| 2004/0161638 A1 | 8/2004 | Maeda et al. | |
| 2004/0191571 A1* | 9/2004 | Hirayama | G11B 5/65 |
| | | | 428/828.1 |
| 2009/0155626 A1 | 6/2009 | Mukai | |
| 2010/0039730 A1 | 2/2010 | Ishibashi et al. | |
| 2011/0097603 A1 | 4/2011 | Onoue | |
| 2011/0311841 A1* | 12/2011 | Saito | G11B 5/65 |
| | | | 428/848.1 |
| 2012/0082866 A1* | 4/2012 | Xiao | G11B 5/855 |
| | | | 428/831 |

FOREIGN PATENT DOCUMENTS

| | | |
|---|---|---|
| CN | 102737653 A | 10/2012 |
| JP | 7-244831 A | 9/1995 |
| JP | 2002-197630 A | 7/2002 |
| JP | 2004-310910 A | 11/2004 |
| JP | 2004-362730 A | 12/2004 |
| JP | 2007-026642 A | 2/2007 |
| JP | 2007-272990 A | 10/2007 |
| JP | 2009-146532 A | 7/2009 |
| JP | 2009238299 A | 10/2009 |
| JP | 2011123976 A | 6/2011 |
| JP | 2011-192320 A | 9/2011 |
| WO | 2010/035810 A1 | 4/2010 |

OTHER PUBLICATIONS

Communication dated May 5, 2016 issued by the State Intellectual Property Office of the People's Republic of China in counterpart application No. 201410028681.2.

Communication dated Apr. 25, 2017 from the Japanese Patent Office in counterpart application No. 2014-007216.

* cited by examiner

METHOD OF MANUFACTURING MAGNETIC RECORDING MEDIUM, MAGNETIC RECORDING MEDIUM, AND MAGNETIC RECORDING AND REPRODUCING APPARATUS

BACKGROUND OF THE INVENTION

Field of the Invention

The present invention relates to a method of manufacturing a magnetic recording medium, a magnetic recording medium, and a magnetic recording and reproducing apparatus.

Priority is claimed on Japanese Patent Application No. 2013-010088, filed on Jan. 23, 2013 and Japanese Patent Application No. 2014-007216, filed on Jan. 17, 2014 the content of which is incorporated herein by reference.

Description of Related Art

A hard disk drive (HDD), which is a kind of a magnetic recording and reproducing apparatus, currently shows an annual growth rate of 50% or higher in its recording density, which is expected to continue in the future. According to this trend, a magnetic head and a magnetic recording medium suitable for high recording density have been developed.

A magnetic recording and reproducing apparatus that is currently available on the market is mounted with a perpendicular magnetic recording medium in which an easy axis of magnetization in a magnetic film is mainly perpendicularly orientated, as a magnetic recording medium. In the perpendicular magnetic recording medium, since the influence due to an inverse magnetic field in a boundary region between recording bits is small and a clear bit boundary is formed, even in high recording density, a noise increase is suppressed. In addition, in the perpendicular magnetic recording medium, since a decrease in a recording bit volume associated with high recording density is small, a thermal fluctuation characteristic is excellent.

Further, in order to meet the demand for higher recording density of the magnetic recording medium, a single magnetic pole head having excellent writing performance with respect to a perpendicular magnetic layer has been studied for use. Specifically, a magnetic recording medium has been proposed in which a layer formed of a soft magnetic material, a so-called backing layer, is provided between a perpendicular magnetic layer that is a recording layer and a non-magnetic substrate to improve magnetic flux entering/exiting efficiency between the single magnetic pole head and the magnetic recording medium.

Further, in order to improve the recording and reproducing characteristic and the thermal fluctuation characteristic of the perpendicular magnetic recording medium, a method of forming plural magnetic layers using an orientation control layer and forming a crystal grain of each magnetic layer as a continuous columnar crystal to improve vertical orientation of the magnetic layer has been proposed (for example, see Japanese Unexamined Patent Application, First Publication No. 2004-310910).

Further, Japanese Unexamined Patent Application, First Publication No. H07-244831 discloses a method of providing a crystal orientation-facilitating layer on a substrate in advance, and sputter-depositing a perpendicular magnetic anisotropic thin film through the crystal orientation-facilitating layer at a sputtering gas pressure of 10 Pa or higher.

Furthermore, a technique in which Ru is used as the orientation control layer has been proposed (For example, see Japanese Unexamined Patent Application, First Publication No. 2007-272990). It is known that Ru forms a dome-like convex part at the top of a columnar crystal. Thus, by growing a crystal grain of a magnetic layer or the like on the orientation control layer having the convex part, formed of Ru, it is possible to accelerate a separation structure of the grown crystal grains and to isolate the crystal grains. Thus, an effect of growing magnetic particles in a columnar shape is obtained.

Further, a magnetic recording medium in which a ruthenium-containing layer formed at a low pressure argon atmosphere (0.6 Pa), a ruthenium-containing layer formed at a high pressure argon atmosphere (10 Pa) and a perpendicular magnetic layer are sequentially formed on a substrate has been proposed (see Japanese Unexamined Patent Application, First Publication No. 2002-197630). As the Ru layer is formed at a high sputtering pressure on the Ru layer formed at a low sputtering pressure, it is possible to improve the orientation of the Ru layer, to improve the orientation of the perpendicular magnetic layer grown thereon, and to miniaturize magnetic particles.

Further, PCT International Publication No. WO2010/035810 discloses a technique in which an Ru layer is formed at a high gas pressure on an Ru layer formed at a low gas pressure and Co and oxygen are included in the Ru layer formed at the high gas pressure, to miniaturize crystal grains of the Ru layer formed at the high gas pressure. Further, in PCT International Publication No. WO2010/035810, as an oxide included in the granular layer, SiO2, $TiO_2$ or $Cr_2O_3$ is used, for example.

SUMMARY OF THE INVENTION

However, in order to increase recording density of the magnetic recording medium, in a case where a two-stage deposition where the Ru layer formed by sputtering at the high gas pressure is formed on the Ru layer formed by sputtering at the low gas pressure is performed to form the orientation control layer having fine crystal grains and to miniaturize the magnetic particles of the columnar structure of the perpendicular magnetic layer formed on the orientation control layer, the following problems occur.

That is, if the sputtering is performed at the high gas pressure, the mean free path of sputtered particles is shortened, and if energy is reduced, and gas molecules are easily mixed into grown particles, to thereby reduce the crystallinity of the Ru layer to be formed. Thus, it is difficult to perform sputtering at a high gas pressure to form an Ru layer with high hardness.

In order to form an Ru layer with high hardness, a technique is considered in which sputtering is not performed at a high gas pressure. However, if sputtering is not performed at a high gas pressure, a dome-like convex part is hardly formed at the top of a columnar crystal that forms an orientation control layer. Accordingly, it is difficult to achieve an effect of separating crystal grains of a perpendicular magnetic layer grown on the orientation control layer to miniaturize magnetic particles of the perpendicular magnetic layer.

For this reason, in the related art, when the orientation control layer is formed using the two-stage deposition, in order to form the dome-like convex part at the top of the columnar crystal that forms the orientation control layer, the sputtering has been performed at the high gas pressure while sacrificing the hardness of the Ru layer. Consequently, in the magnetic recording medium that includes the orientation control layer formed using the two-stage deposition, a surface hardness is not sufficient, and the surface of the magnetic recording medium is easily scratched, thereby making it difficult to achieve sufficient reliability.

Further, the convex shape due to the dome-like convex part of the orientation control layer is continuous to the surface of the perpendicular magnetic layer, and is continuous to a protective layer formed on the surface of the perpendicular magnetic layer. The Ru layer formed by sputtering at the high gas pressure has large irregularity on the surface thereof. Thus, the magnetic recording medium provided with the orientation control layer having the Ru layer formed by sputtering at the high gas pressure has a high surface roughness. If the surface roughness of the magnetic recording medium is high, this becomes an obstacle for reduction in a floating height of a magnetic head, compared with the related art, and adaptability to high recording density.

Hence, it is desirable to provide a method of manufacturing a magnetic recording medium, capable of miniaturizing magnetic particles of a columnar structure in a perpendicular magnetic layer to increase recording density and capable of forming an orientation control layer with low surface roughness and high hardness to achieve excellent surface scratch resistance, high reliability and adaptability to high recording density.

An advantage of some aspects of the invention is to provide a method of manufacturing a magnetic recording medium with high reliability and adaptability to high recording density.

Another advantage of some aspects of the invention is to provide a magnetic recording and reproducing apparatus that includes the magnetic recording medium with high reliability and high recording density, manufactured using the method of manufacturing the magnetic recording medium.

The present invention provides the following configurations.

(1) According to an aspect of the invention, a method of manufacturing a magnetic recording medium is provided, comprising at least: forming an orientation control layer that controls orientation of an immediately above layer thereof on a non-magnetic substrate; and forming a perpendicular magnetic layer in which an easy axis of magnetization is mainly perpendicularly orientated to the non-magnetic substrate, in which the forming of the orientation control layer includes forming a granular layer having a granular structure that includes Ru or a material in which Ru is a main component and an oxide having a melting point which is greater than or equal to 450° C. and less than or equal to 1000° C., by a sputtering method, and the forming of the perpendicular magnetic layer includes growing crystal grains to form columnar crystals that are continuous in a thickness direction together with crystal grains that form the orientation control layer.

(2) In the method of manufacturing the magnetic recording medium according to (1), the oxide having the melting point which is greater than or equal to 450° C. and less than or equal to 1000° C. may be an oxide having a melting point which is greater than or equal to 450° C. and less than or equal to 850° C.

(3) In the method of manufacturing the magnetic recording medium according to (1) or (2), the oxide having the melting point which is greater than or equal to 450° C. and less than or equal to 1000° C. may be either of $B_2O_3$ or $In_2O_3$.

(4) In the method of manufacturing the magnetic recording medium according to any one of (1) to (3), the forming of the granular layer may be performed at a sputtering gas pressure which is greater than or equal to 3 Pa and less than or equal to 6 Pa.

(5) In the method of manufacturing the magnetic recording medium according to any one of (1) to (4), the forming of the orientation control layer may include forming a low gas pressure layer formed of Ru or a material in which Ru is a main component in a sputtering gas pressure range of 0.1 Pa to 3 Pa by a sputtering method, before the forming of the granular layer, and the forming of the granular layer may be performed at a sputtering pressure higher than that in the forming of the low gas pressure layer.

(6) In the method of manufacturing the magnetic recording medium according to any one of (1) to (5), the granular layer may include the oxide having a melting point which is greater than or equal to 450° C. and less than or equal to 1000° C. in a range of 2 vol. % to 20 vol. % in total.

(7) In the method of manufacturing the magnetic recording medium according to any one of (1) to (6), in the forming of the perpendicular magnetic layer, the perpendicular magnetic layer may be formed by the sputtering method.

(8) According to another aspect of the invention, a magnetic recording medium is provided, comprising, on a non-magnetic substrate, at least an orientation control layer that controls orientation of an immediately above layer thereof and a perpendicular magnetic layer in which an easy axis of magnetization is mainly perpendicularly orientated to the non-magnetic substrate, wherein the orientation control layer includes a granular layer having a granular structure that includes Ru or a material in which Ru is a main component and an oxide having a melting point which is greater than or equal to 450° C. and less than or equal to 1000° C., the perpendicular magnetic layer includes columnar crystals that are continuous in a thickness direction together with crystal grains that form the orientation control layer, and a surface roughness (Ra) of a surface of the magnetic recording medium, which is measured by an atomic force microscope, is 3 angstroms or less.

(9) According to still another aspect of the invention, a magnetic recording and reproducing apparatus is provided, including: the magnetic recording medium according to (8); and a magnetic head that performs recording and reproduction of information with respect to the magnetic recording medium.

According to the method of manufacturing the magnetic recording medium according to the above aspect of the invention, the method includes the forming of the orientation control layer and the forming of the perpendicular magnetic layer, and the forming of the orientation control layer includes the forming the granular layer having the granular structure that includes Ru or the material in which Ru is the main component and the oxide having the melting point which is greater than or equal to 450° C. and less than or equal to 1000° C., by the sputtering method. Thus, it is possible to miniaturize magnetic particles of a columnar structure of the orientation control layer and the perpendicular magnetic layer grown on the orientation control layer, and to provide a magnetic recording medium capable of achieving a signal-to-noise ratio (SNR) suitable for high density recording.

Further, according to the granular layer having the granular structure that includes Ru or the material in which Ru is the main component and the oxide having the melting point which is greater than or equal to 450° C. and less than or equal to 1000° C., formed by the method of manufacturing the magnetic recording medium according to the above aspect of the invention, it is possible to separate crystal grains even when being formed at a low sputtering pressure, and to miniaturize magnetic particles of a columnar structure of the perpendicular magnetic layer grown thereon. Thus, according to the method of manufacturing the magnetic recording medium according to the invention, it is possible to manufacture a magnetic recording medium with high surface scratch resistance and high reliability.

Furthermore, according to the method of manufacturing the magnetic recording medium according to the above aspect of the invention, by forming the granular layer at a low sputtering pressure, it is possible to achieve an orientation control layer with reduced roughness. Accordingly, it is possible to manufacture a magnetic recording medium with a smooth surface in which a surface roughness (Ra) obtained by measuring a surface thereof using an atomic force microscope is 3 angstroms or less.

Accordingly, the magnetic recording and reproducing apparatus including the magnetic recording medium manufactured by the method of manufacturing the magnetic recording medium according to the invention and the magnetic head that performs recording and reproduction of information with respect to the magnetic recording medium has adaptability to high recording density and high reliability.

DETAILED DESCRIPTION OF THE INVENTION

Figure 1:
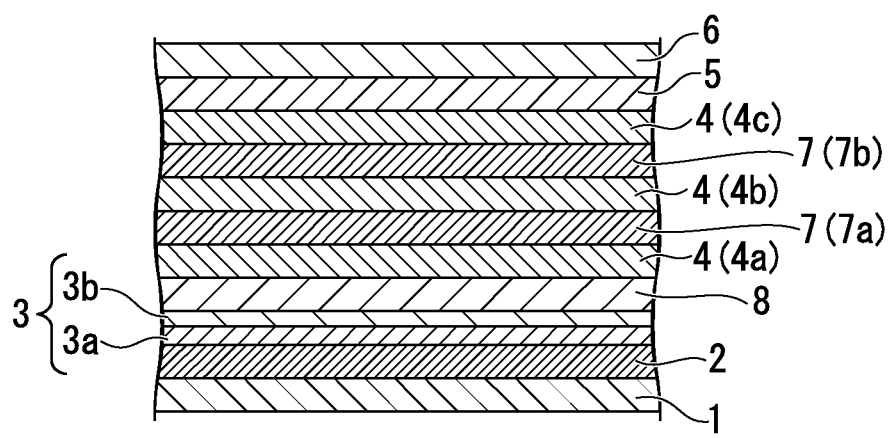
FIG. 1 is a diagram illustrating an example of a magnetic recording medium manufactured by application of an embodiment of the invention.

Hereinafter, a manufacturing method of a magnetic recording medium, a magnetic recording medium, and a magnetic recording and reproducing apparatus according to an embodiment of the invention will be described with reference to the accompanying drawings. In the drawings used in the following description, characteristic parts may be enlarged for ease of description, and the dimensional ratio of respective components is not necessarily the same as an actual dimension ratio.

(Magnetic Recording Medium)

Hereinafter, a magnetic recording medium shown in FIG. 1 will be described as an example of the magnetic recording medium according to an embodiment of the invention.

FIG. 1 is a diagram illustrating an example of a magnetic recording medium manufactured by application of a magnetic recording medium manufacturing method of the invention. The magnetic recording medium shown in FIG. 1 has a structure in which a soft magnetic underlayer 2, an orientation control layer 3 that controls orientation of an immediate above layer thereof, a non-magnetic underlayer 8, a perpendicular magnetic layer 4 in which an easy axis of magnetization is mainly perpendicularly orientated to a non-magnetic substrate 1, a protective layer 5, and a lubricating layer 6 are sequentially laminated on the non-magnetic substrate 1.

In the magnetic recording medium of the present invention, surface roughness (Ra) obtained by measuring its surface with an atomic force microscope (AFM) is 3 angstroms or less, and it is preferable that the surface roughness be as smooth as possible.

According to the magnetic recording medium of the present embodiment, since the surface roughness (Ra) of the surface is 3 angstroms or less, it is possible to reduce the distance between a magnetic head and the perpendicular magnetic layer and to obtain a SNR suitable for high density recording. In the magnetic recording medium of the present embodiment, the surface roughness is 3 angstroms or less when measured using the atomic force microscope, but the surface roughness may be measured with the lubricating layer that is the uppermost surface of the magnetic recording medium being removed.

[Non-Magnetic Substrate]

As the non-magnetic substrate 1, a metallic substrate formed of a metallic material such as aluminum or aluminum alloy or a non-metallic substrate formed of a non-metallic material such as glass, ceramic, silicon, silicon carbide or carbon may be used. Further, as the non-metallic substrate 1, a substrate is obtained by forming an NiP layer or an NiP alloy layer on a surface of a metallic substrate or a non-metallic substrate using a plating method or a sputtering method, for example.

As the glass substrate, for example, an amorphous glass, a crystallized glass or the like may be used. For example, a general-purpose soda lime glass, an aluminosilicate glass or the like may be used as the amorphous glass. For example, a lithium-based crystallized glass or the like may be used as the crystallized glass.

As the ceramic substrate, for example, a sintered body in which general-purpose aluminum oxide, aluminum nitride, silicon nitride or the like is used as a main component; a fiber-reinforce thereof; or the like may be used.

An average surface roughness (Ra) of the non-magnetic substrate 1 is preferably 2 nm (20 angstroms) or less, and more preferably 1 nm or less, which is suitable for high density recording with a magnetic head being at a low floating height.

Further, the non-magnetic substrate 1 preferably has a minute undulation (Wa) on the surface of 0.3 nm or less (more preferably 0.25 nm or less), which is suitable for high density recording with a magnetic head being at a low floating height. The minute undulation (Wa) may be measured as an average surface roughness in a measurement range of 80 μm using a surface roughness measurement apparatus P-12 (made by KLM-Tencor), for example.

Further, as the non-magnetic substrate 1, a substrate in which the average surface roughness (Ra) of at least one of a chamfered part and a side surface part of a chamfered area of an end section is preferably 10 nm or less (more preferably 9.5 nm or less) is used, which is preferable in view of flight safety of a magnetic head.

As the non-magnetic substrate 1 is in contact with the soft magnetic underlayer 2 in which Co or Fe is used as a main component, the non-magnetic substrate 1 may be corroded due to the influence of surface-adsorbed gas or moisture, diffusion of components of the substrate, or the like. By providing an adhesive layer between the non-magnetic substrate 1 and the soft magnetic underlayer 2, it is possible to suppress this problem. As a material of the adhesive layer, for example, Cr, Cr alloy, Ti, Ti alloy or the like may be appropriately selected.

It is preferable that the thickness of the adhesive layer be 2 nm (20 angstroms) or more.

[Soft Magnetic Underlayer]

The soft magnetic underlayer 2 is formed on the non-magnetic substrate. The soft magnetic underlayer 2 is provided to increase a perpendicular component, to the surface of the substrate, of a magnetic flux generated from a magnetic head and to strongly fix the magnetization direction of the perpendicular magnetic layer 4 on which information is recorded in the direction perpendicular to the non-magnetic substrate 1. This effect is particularly remarkable when a perpendicular recording single magnetic pole head is used as a recording and reproducing magnetic head.

For example, as the soft magnetic underlayer 2, a soft magnetic material that contains Fe, Ni, Co or the like may be used. For example, a CoFe based alloy (CoFeTaZr, CoFeZrNb or the like), an FeCo based alloy (FeCo, FeCoV or the like), an FeNi based alloy (FeNi, FeNiMo, FeNiCr, FeNiSi or the like), an FeAl based alloy (FeAl, FeAlSi, FeAlSiCr, FeAlSiTiRu, FeAlO or the like), an FeCr based alloy (FeCr, FeCrTi, FeCrCu or the like), an FeTa based alloy (FeTa, FeTaC, FeTaN or the like), an FeMg based alloy (FeMgO or the like), an FeZr based alloy (FeZrN or the like), an FeC based alloy, an FeN based alloy, an FeSi based alloy, an FeP based alloy, an FeNb based alloy, an FeHf based alloy, an FeB based alloy or the like may be used as a specific soft magnetic material.

As the soft magnetic underlayer 2, a material having a granular structure in which microcrystalline structures or fine crystal grains of FeAlO, FeMgO, FeTAN, FeZrN or the like that contains Fe of 60 at % (atomic %) or more are dispersed in a matrix form may be used.

Alternatively, as the soft magnetic underlayer 2, a Co alloy that contains Co of 80 at % or more, contains at least one of Zr, Nb, Ta, Cr, Mo and the like, and has an amorphous structure may be used. As the Co alloy having the amorphous structure, for example, CoZr, CoZrNb, CoZrTa, CoZrCr, CoZrMo based alloy, or the like may be preferably used.

A coercive force Hc of the soft magnetic underlayer 2 is preferably 100 (Oe) or less (more preferably, 20 (Oe) or less). 1 Oe represents 79 A/m. If the coercive force Hc of the soft magnetic underlayer 2 exceeds the range, a soft magnetic characteristic is not sufficient, and a reproducing waveform is distorted from a so-called square wave, which is not preferable.

A saturation magnetic flux density Bs of the soft magnetic underlayer 2 is preferably 0.6 T or more (more preferably 1 T or more). If the saturation magnetic flux density Bs of the soft magnetic underlayer 2 is smaller than the range, a reproducing waveform is distorted from a so-called square wave, which is not preferable.

Further, Bs·t (T·nm) that is the product of the saturation magnetic flux density Bs (T) of the soft magnetic underlayer 2 and the thickness t (nm) of the soft magnetic underlayer 2 is preferably 15 T·nm or more (more preferably 25 T·nm or more). If Bs·t of the soft magnetic underlayer 2 is smaller than the range, a reproducing waveform is distorted and an overwrite (OW) characteristic (recording characteristic) is worsened, which is not preferable.

It is preferable that the soft magnetic underlayer 2 be formed of two layers of soft magnetic films, and it is preferable that an Ru film be provided between the two layers of soft magnetic films. By adjusting the thickness of the Ru film in the range of 0.4 nm to 1.0 nm or 1.6 nm to 2.6 nm, it is possible to form the two layers of soft magnetic films to have an antiferromagnetic coupling (AFC) structure. When the soft magnetic underlayer 2 employs the AFC structure, it is possible to suppress a so-called spike noise.

On the uppermost surface (surface on the side of the orientation control layer 3) of the soft magnetic underlayer 2, it is preferable that a material that forms the soft magnetic underlayer 2 be partially or completely oxidized. Specifically, for example, it is preferable that an oxide obtained by partially oxidizing the material that forms the soft magnetic underlayer 2 or an oxide obtained by entirely oxidizing the material be arranged on the surface (surface on the side of the orientation control layer 3) of the soft magnetic underlayer 2 or in the vicinity thereof. Thus, it is possible to suppress magnetic fluctuation of the surface of the soft magnetic underlayer 2, and to reduce noise due to the magnetic fluctuation, thereby improving recording and reproducing characteristics of the magnetic recording medium.

A sheet layer may be provided between the soft magnetic underlayer 2 and the orientation control layer 3. The sheet layer is provided to control the size of crystal grains of the orientation control layer 3. An NiW alloy may be used as a material used in the seed layer. Further, a layer or the like having an fcc structure may be used as the sheet layer. Specifically, a layer that includes Ni, Cu, Rh, Pd, Ag, Ir, Pt, Au or Al may be used.

[Orientation Control Layer]

The orientation control layer 3 that controls orientation of the perpendicular magnetic layer 4 is formed on the soft magnetic underlayer 2. The orientation control layer 3 miniaturizes crystal grains of the perpendicular magnetic layer 4, to thereby improve the recording and reproducing characteristics.

In order to miniaturize the magnetic particles of the perpendicular magnetic layer 4, as shown in FIG. 1, it is preferable that the orientation control layer 3 include a low gas pressure layer 3a formed on the soft magnetic underlayer 2, and a high gas pressure layer (granular layer) 3b formed on the low gas pressure layer 3a.

The low gas pressure layer 3a is used for increasing the nucleation density of the orientation control layer 3.

The low gas pressure layer 3a is formed of Ru or a material in which Ru is used as a main component. As the material in which Ru is used as a main component, which forms the low gas pressure layer 3a, an Ru based alloy is used.

In the present embodiment, since the low gas pressure layer 3a is formed of Ru or the material in which Ru is used as a main material, a dome-like convex part is formed at the top of a columnar crystal that forms the low gas pressure layer 3a.

Accordingly, by sequentially forming the high gas pressure layer 3b and the perpendicular magnetic layer 4 on the low gas pressure layer 3a, crystal grains of the high gas pressure layer 3b and the perpendicular magnetic layer 4 are made to grow on the dome-like convex part of the low gas pressure layer 3a. Accordingly, the orientation control layer 3 of the present embodiment has excellent orientation capable of facilitating separation of the crystal grains of the perpendicular magnetic layer 4 and isolating the crystal grains to grow in a columnar shape.

It is preferable that the low gas pressure layer 3a have a thickness of in the range of 8 nm to 12 nm. When the thickness of the low gas pressure layer 3a is in the range of 8 nm to 12 nm, the distance between the magnetic head and the soft magnetic underlayer 2 in recording is decreased, and thus, it is possible to improve the recording and reproducing characteristics without deteriorating resolution of a reproduced signal.

If the thickness of the low gas pressure layer 3a is smaller than the range, the effects of improving the orientation of the perpendicular magnetic layer 4 and miniaturizing the magnetic particles 42 that form the perpendicular magnetic layer 4 becomes insufficient. Thus, a favorable S/N ratio (SNR) may not be obtained. Further, if the low gas pressure layer 3a exceeds the range, the distance between the magnetic head and the soft magnetic layer 2 in recording is increased, and magnetic coupling between the magnetic head and the soft magnetic underlayer 2 is weakened, which may cause a recording characteristic (OW) that is not suitable for high density recording.

The high gas pressure layer 3b has a granular structure. The granular structure includes Ru or a material in which Ru is used as a main component, and the granular structure includes an oxide having a melting point which is greater than or equal to 450° C. and less than or equal to 1000° C. (450° C. to 1000° C.). It is preferable that the oxide have a melting point which is greater than or equal to 450° C. and less than or equal to 850° C. (450° C. to 850° C.). In the high gas pressure layer 3b, since the oxide having the melting point of 450° C. to 1000° C. easily surrounds the periphery of Ru or the material in which Ru is used as a main component, it is possible to easily obtain a segregation structure of RU or particles in which Ru is used as a main component. Thus, even though the sputtering gas pressure is formed at a low sputtering pressure in the range of 6 Pa or lower by the sputtering method, the crystal grains are separated. Thus, it is possible to miniaturize the magnetic particles of the columnar structure of the perpendicular magnetic layer 4 grown on the high gas pressure layer 3b.

As the oxide having the melting point of 450° C. to 1000° C., included in the high gas pressure layer 3b, $In_2O_3$, $TeO_2$, $Sb_2O_3$, $B_2O_3$ or the like may be used. Particularly, $B_2O_3$ having a remarkably low melting point is preferably used. As long as the overall melting point of the oxide included in the high gas pressure layer 3b is 450° C. or higher and 1000° C. or lower, a mixture made of two or more types of oxides may be used. For example, a mixture of an oxide having a melting point of 1000° C. or lower such as $In_2O_3$, $TeO_2$, $Sb_2O_3$, $B_2O_3$ or the like and an oxide having a melting point higher than 1000° C. such as $SiO_2$, $TiO_2$, $Cr_2O_3$, $Ta_2O_5$, $Nb_2O_5$ or the like may be used. Table 1 shows melting points of oxides used as materials of the high gas pressure layer.

TABLE 1

| MATERIAL | MELTING POINT (° C.) |
| --- | --- |
| $IN_2O_3$ | 850 |
| $TeO_2$ | 733 |
| $Sb_2O_3$ | 656 |
| $B_2O_3$ | 450 |
| $TiO_2$ | 1870 |
| $Cr_2O_3$ | 2435 |
| $SiO_2$ | 1650 |
| $Ta_2O_5$ | 1468 |
| $Nb_2O_3$ | 1520 |

Further, as the material in which Ru is used as a main component, which forms the high gas pressure layer 3b, an Ru based alloy may be used.

It is preferable that the high gas pressure layer 3b include the oxide having the melting point of 450° C. to 1000° C. in the range of 2 vol. % (volume %) to 20 vol. % in total, and more preferably, in the range of 10 vol. % to 13 vol. %. When the high gas pressure layer 3b includes the oxide having the melting point of 450° C. to 1000° C. in the range of 2 vol. % to 20 vol. % in total, it is possible to obtain the orientation control layer 3 having excellent orientation.

When the content of the oxide having the melting point of 450° C. to 1000° C. in the high gas pressure layer 3b exceeds the range, the oxide may remain in the metallic particles in the high gas pressure layer 3b, to thereby deteriorate the crystallinity and orientation of the metallic particles and the crystallinity and orientation of the perpendicular magnetic layer 4 formed on the orientation control layer 3, which is not preferable. Further, when the content of the oxide having the melting point of 450° C. to 1000° C. in the high gas pressure layer 3b is smaller than the range, the separation effect of the crystal grains obtained by including the oxide having the melting point of 450° C. to 1000° C. in the high gas pressure layer 3b may not be sufficiently obtained.

Here, in the magnetic recording medium of the present embodiment, the relationship between the crystal grains that form the orientation control layer 3 and the magnetic particles that form the perpendicular magnetic layer 4 will be described with reference to the accompanying drawings.

Figure 2:
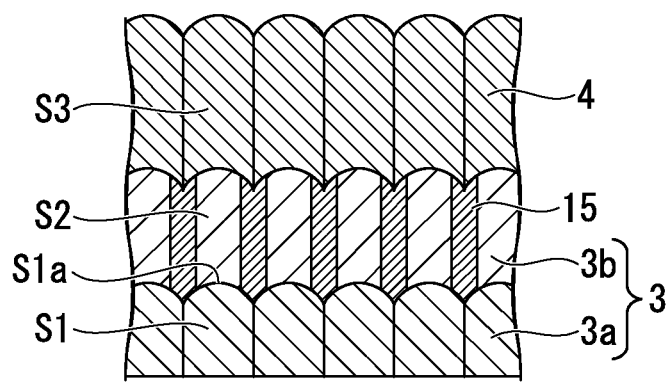
FIG. 2 is an enlarged view schematically illustrating a laminated structure of an orientation control layer and a perpendicular magnetic layer, which is a cross-sectional view illustrating a state where columnar crystals of the respective layers are grown perpendicularly to a substrate.

FIG. 2 is an enlarged view schematically illustrating the laminated structure of the orientation control layer 3 and the perpendicular magnetic layer 4, which is a cross-sectional view illustrating a state where columnar crystals of the respective layers are grown perpendicularly to the substrate. In FIG. 2, the members other than the low gas pressure layer 3a and the high gas pressure layer 3b that form the orientation control layer 3 and the perpendicular magnetic layer 4 are not shown.

As shown in FIG. 2, an irregular surface S1a is formed on the low gas pressure layer 3a, in which the top of a columnar crystal S1 that forms the low gas pressure layer 3a has a dome-like convex. A crystal grain that forms the high gas pressure layer 3b is grown as a columnar crystal S2 on the irregular surface S1a of the low gas pressure layer 3a in the thickness direction from the irregular surface S1a. Since the high gas pressure layer 3b has the granular structure, an oxide 15 is formed in the vicinity of the columnar crystal S2 that forms the high gas pressure layer 3b. Further, a crystal grain of the perpendicular magnetic layer 4 is grown as a columnar crystal S3 in the thickness direction on the columnar crystal S2 that forms the high gas pressure layer 3b.

As described above, in the magnetic recording medium of the present embodiment, the columnar crystal S2 of the high gas pressure layer 3b and the columnar crystal S3 of the perpendicular magnetic layer 4 are epitaxially formed as continuous columnar crystals on the columnar crystal S1 of the low gas pressure layer 3a. In the present embodiment, the perpendicular magnetic layer 4 is provided as plural layers, and the crystal grains that form the respective layers of the perpendicular magnetic layer 4 repeats the epitaxial growth of the continuous columnar crystals from the orientation control layer 3 to the uppermost perpendicular magnetic layer 4. Accordingly, in the present embodiment, by miniaturizing the crystal grains that form the low gas pressure layer 3a to achieve the columnar crystal S1 of high density, the columnar crystal S2 of the high gas pressure layer 3b and the columnar crystal S3 of the perpendicular magnetic layer 4 that are grown in the thickness direction from the top of the columnar crystal S1 are also formed in high density. Consequently, the magnetic recording medium of the present embodiment is realized as a magnetic recording medium that is not easily damaged, with high surface hardness.

[Non-Magnetic Underlayer]

In the magnetic recording medium of the present embodiment, the non-magnetic underlayer 8 is provided between the orientation control layer 3 and the perpendicular magnetic layer 4. It is preferable that the non-magnetic underlayer 8 be provided between the orientation control layer 3 and the perpendicular magnetic layer 4, but the non-magnetic underlayer 8 may not be provided therebetween. Disturbance of the crystal growth easily occurs in an initial part of the perpendicular magnetic layer 4 immediately above the orientation control layer 3, which causes noise. By providing the non-magnetic underlayer 8, it is possible to suppress the noise.

The non-magnetic underlayer 8 of the present embodiment is epitaxially grown as a columnar crystal continuous to the columnar crystal of the low gas pressure layer 3a of the orientation control layer 3 and the columnar crystal of the high gas pressure layer 3b.

The thickness of the non-magnetic underlayer 8 is preferably 0.2 nm or more and 3 nm or less. If the thickness of the non-magnetic underlayer 8 exceeds 3 nm, Hc and Hn are reduced, which is not preferable.

The non-magnetic underlayer 8 is preferably formed of a material that includes Cr and an oxide. The content of Cr is preferably 25 at % (atomic %) or higher and 50 at % or lower. For example, an oxide of Cr, Si, Ta, Al, Ti, Mg, Co or the like is preferably used as the oxide, and $TiO_2$, $Cr_2O_3$, $SiO_2$ or the like may be more preferably used. Further, the content of the oxide is preferably 3 mol % or more and 18 mol % or less with respect to a total molar amount calculated using, for example, an alloy of Co, Cr, Pt and the like as one compound, which forms the magnetic particles.

Further, the non-magnetic underlayer 8 is preferably formed of a complex oxide obtained by adding two or more types of oxides. Particularly, $Cr_2O_3$—$SiO_2$, $Cr_2O_3$—$TiO_2$, $Cr_2O_3$—$SiO_2$—$TiO_2$ or the like may be preferably used. Further, CoCr—$SiO_2$, CoCr—$TiO_2$, CoCr—$Cr_2O_3$—$SiO_2$, CoCr—$TiO_2$—$Cr_2O_3$, CoCr—$Cr_2O_3$—$TiO_2$—$SiO_2$ or the like may be preferably used. Further, Pt may be added in view of the crystal growth.

[Perpendicular Magnetic Layer]

The perpendicular magnetic layer 4 is formed on the non-magnetic underlayer 8. As shown in FIG. 1, the perpendicular magnetic layer 4 includes three layers of a lower magnetic layer 4a, an intermediate magnetic layer 4b, and an upper magnetic layer 4c, from the side of the non-magnetic substrate 1. In the magnetic recording medium of the present embodiment, a lower non-magnetic layer 7a is included between the magnetic layer 4a and the magnetic layer 4b, and an upper non-magnetic layer 7b is included between the magnetic layer 4b and the magnetic layer 4c, and thus, a structure in which the magnetic layers 4a to 4c and the non-magnetic layers 7a and 7b are alternately laminated is obtained.

The crystal grains that form the respective magnetic layers 4a to 4c and the respective non-magnetic layers 7a and 7b form continuous columnar crystals in the thickness direction together with the crystal grains that form the orientation control layer 3. The perpendicular magnetic layer 4 (the magnetic layers 4a to 4c and the non-magnetic layers 7a and 7b) is epitaxially grown on the non-magnetic underlayer 8 as columnar crystals continuous to the columnar crystals of the low gas pressure layer 3a and the high gas pressure layer 3b of the orientation control layer 3.

The non-magnetic layers 7a and 7b are not particularly limited, but for example, a layer formed of Ru or Ru alloy may be used. Particularly, by setting the thickness of the non-magnetic layers 7a and 7b in the range of 0.6 nm to 1.2 nm, it is possible to achieve antiferromagnetic coupling (AFC) of the magnetic layers 4a, 4b and 4c. Further, in the present embodiment, the respective magnetic layers 4a, 4b and 4c may be magnetostatically coupled by a ferromagnetic exchange coupling (FC).

Figure 3:
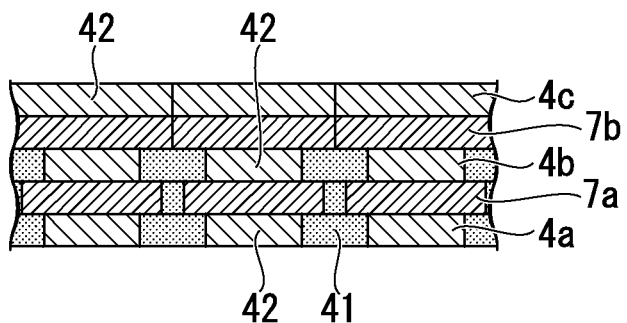
FIG. 3 is an enlarged cross-sectional view illustrating a laminated structure of a magnetic layer and a non-magnetic layer that form a perpendicular magnetic layer.

FIG. 3 is an enlarged cross-sectional view illustrating a laminated structure of a magnetic layer and a non-magnetic layer that form a perpendicular magnetic layer. As shown in FIG. 3, the magnetic layer 4a that forms the perpendicular magnetic layer 4 is a magnetic layer of a granular structure, and preferably includes a magnetic particle (crystal grain with magnetism) 42 including Co, Cr and Pt, and an oxide 41.

As the oxide 41, for example, an oxide of Cr, Si, Ta, Al, Ti, Mg, Co or the like may be preferably used. Particularly, $TiO_2$, $Cr_2O_3$, $SiO_2$ or the like may be preferably used. Further, it is preferable that the magnetic layer 4a be formed of a complex oxide obtained by adding two or more types of oxides. Particularly, $Cr_2O_3$—$SiO_2$, $Cr_2O_3$—$TiO_2$, $Cr_2O_3$—$SiO_2$—$TiO_2$ or the like may be preferably used.

The magnetic particles 42 are preferably dispersed in the magnetic layer 4a. The magnetic particle 42 preferably forms a columnar structure that vertically penetrates the magnetic layers 4a and 4b and the magnetic layer 4c. With such a structure, the orientation and crystallinity of the magnetic layer 4a become excellent, and consequently, it is possible to obtain a SNR suitable for high density recording.

The content of the oxide 41 included in the magnetic layer 4a is preferably 3 mol % or more and 18 mol % or less with respect to a total molar amount calculated using, for example, an alloy of Co, Cr, Pt and the like as one compound, which forms the magnetic particles 42, and more preferably 6 mol % or more and 13 mol % or less. The reason why the above-mentioned range is preferably set as the content of the oxide 41 in the magnetic layer 4a is because the oxide 41 can be separated in the vicinity of the magnetic particle 42 when the magnetic layer 4a is formed and the isolation and miniaturization of the magnetic particle 42 can be achieved.

On the other hand, when the content of the oxide 41 exceeds the range, the oxide 41 may remain in the magnetic particle 42 to deteriorate the orientation and crystallinity of the magnetic particle 42, and the oxide 41 is separated above and below the magnetic particle 42 and the columnar structure in which the magnetic particle 42 vertically penetrates the magnetic layers 4a to 4c may not be formed, which is not preferable. Further, when the content of the oxide 41 is smaller than the range, the separation and miniaturization of the magnetic particle 42 becomes insufficient, and consequently, the noise in recording and reproduction is increased, so that a SNR suitable for high density recording cannot be obtained, which is not preferable.

The content of Cr in the magnetic layer 4a is preferably 4 at % or higher and 19 at % or lower (more preferably 6 at % or higher and 17 at % or lower). When the content of Cr in the magnetic layer 4a is set to the range, a magnetic anisotropic constant Ku of the magnetic particle 42 is not excessively lowered, and high magnetization is maintained. As a result, it is possible to obtain a recording and reproducing characteristic suitable for high density recording and a sufficient thermal fluctuation characteristic.

On the other hand, when the content of Cr in the magnetic layer 4a exceeds the range, the magnetic anisotropic constant Ku of the magnetic particle 42 is reduced, the thermal fluctuation characteristic deteriorates, and the crystallinity and orientation of the magnetic particle 42 deteriorate, and thus, the recording and reproducing characteristic deteriorate, which is not preferable. Further, when the content of Cr is smaller than the range, since the magnetic anisotropic constant Ku of the magnetic particle 42 is increased, a perpendicular coercive force is excessively increased. Thus, it is difficult to perform sufficient writing by the magnetic head in data recording, thereby resulting in a recording characteristic (OW) that is not suitable for high density recording, which is not preferable.

The content of Pt in the magnetic layer 4a is preferably 8 at % or higher and 20 at % or lower. If the content of Pt is smaller than 8 at %, the magnetic anisotropic constant Ku necessary for the perpendicular magnetic layer 4 to obtain the thermal fluctuation characteristic suitable for high density recording cannot be obtained, which is not preferable. If the content of Pt exceeds 20 at %, a laminating fault occurs in the magnetic particle 42, and thus, the magnetic anisotropic constant Ku is reduced. Further, if the content of Pt exceeds the range, a layer of the fcc structure is formed in the magnetic particle 42, and thus, the crystallinity and orientation thereof may deteriorate, which is not preferable. Accordingly, in order to obtain the thermal fluctuation characteristic and the recording and reproducing characteristic suitable for high density recording, it is preferable to set the content of Pt in the magnetic layer 4a in the above range.

One or more types of elements selected from B, Ta, Mo, Cu, Nd, W, Nb, Sm, Tb, Ru or Re, in addition to Co, Cr and Pt, may be included in the magnetic particle 42 of the magnetic layer 4a. By including the element, it is possible to facilitate the miniaturization of the magnetic particle 42 or improve the crystallinity or orientation. Thus, it is possible to obtain the recording and reproducing characteristic and thermal fluctuation characteristic suitable for high density recording.

Further, the total content of the elements other than Co, Cr and Pt, included in the magnetic particle 42 is preferably 8 at % or lower. If the total content of the elements exceeds 8 at %, a phase other than an hcp phase is formed in the magnetic particle 42, and the crystallinity and orientation of the magnetic particle 42 deteriorate. Thus, the recording and reproducing characteristic and the thermal fluctuation characteristic suitable for high density recording cannot be obtained, which is not preferable.

As a material suitable for the magnetic layer 4a, for example, 90 (Co14Cr18Pt)-10(SiO$_2$) (in which a mol concentration calculated using a magnetic particle made of Cr of 14 at %, Pt of 18 at % and residual Co as one compound is 90 mol %, and an oxide composition made of SiO$_2$ is 10 mol %), 92(Co10Cr16Pt)-8(SiO$_2$) or 94(Co8Cr14Pt4Nb)-6 (Cr$_2$O$_3$) may be used, or (CoCrPt)—(Ta$_2$O$_5$), (CoCrPt)—(Cr$_2$O$_3$)—(TiO$_2$), (CoCrPt)—(Cr$_2$O$_3$)—(SiO$_2$), (CoCrPt)—(Cr$_2$O$_3$)—(SiO$_2$)—(TiO$_2$), (CoCrPtMo)—(TiO), (CoCrPtW)—(TiO$_2$), (CoCrPtB)—(Al$_2$O$_3$), (CoCrPtTaNd)—(MgO), (CoCrPtBCu)—(Y$_2$O$_3$), (CoCrPtRu)—(SiO$_2$) or the like may be used.

As shown in FIG. 3, similar to the magnetic layer 4a, the magnetic layer 4b that forms the perpendicular magnetic layer 4 is a magnetic layer having the granular structure, and preferably includes the magnetic particle (crystal grain with magnetism) 42 that contains Co, Cr and Pt, and the oxide 41.

The oxide 41 included in the magnetic layer 4b may use an oxide that is the same as the oxide 41 included in the magnetic layer 4a.

The magnetic particle 42 that forms the magnetic layer 4b is preferably dispersed in the magnetic layer 4b. The magnetic particle 42 preferably forms a columnar structure that vertically penetrates the magnetic layers 4a and 4b and the magnetic layer 4c. With such a structure, the orientation and crystallinity of the magnetic particles 42 of the magnetic layer 4b become excellent, and consequently, it is possible to obtain a SNR suitable for high density recording.

The content of the oxide 41 included in the magnetic layer 4b is preferably 3 mol % or more and 18 mol % or less with respect to a total amount of a compound of Co, Cr, Pt and the like, which forms the magnetic particles 42, and more preferably 6 mol % or more and 13 mol % or less. The reason why the above-mentioned range is preferably set as the content of the oxide 41 in the magnetic layer 4b is the same as in the content of the oxide 41 in the magnetic layer 4a that forms the perpendicular magnetic layer 4.

The content of Cr in the magnetic layer 4b is preferably 4 at % or higher and 18 at % or lower (more preferably 8 at % or higher and 15 at % or lower). When the content of Cr is set in the range, the magnetic anisotropic constant Ku of the magnetic particle 42 is not excessively lowered, and high magnetization is maintained. As a result, it is possible to obtain a recording and reproducing characteristic suitable for high density recording and a sufficient thermal fluctuation characteristic.

On the other hand, when the content of Cr in the magnetic layer 4b exceeds the range, the magnetic anisotropic constant Ku of the magnetic particle 42 is reduced, the thermal fluctuation characteristic deteriorates, and the crystallinity and orientation of the magnetic particle 42 deteriorate, and thus, the recording and reproducing characteristic deteriorate, which is not preferable. Further, when the content of Cr is smaller than the range, since the magnetic anisotropic constant Ku of the magnetic particle 42 is increased, the perpendicular coercive force is excessively increased. Thus, it is difficult to perform sufficient writing by the magnetic head in data recording, thereby resulting in a recording characteristic (OW) that is not suitable for high density recording, which is not preferable.

The content of Pt in the magnetic layer 4b is preferably 10 at % or higher and 22 at % or lower. If the content of Pt is smaller than 10 at %, the magnetic anisotropic constant Ku necessary for the perpendicular magnetic layer 4 to obtain the thermal fluctuation characteristic suitable for high density recording cannot be obtained, which is not preferable. If the content of Pt exceeds 22 at %, a laminating fault occurs in the magnetic particle 42, and thus, the magnetic anisotropic constant Ku is reduced. Further, if the content of Pt exceeds the range, a layer of the fcc structure is formed in the magnetic particle 42, and thus, the crystallinity and orientation thereof may deteriorate, which is not preferable. Accordingly, in order to obtain the thermal fluctuation characteristic and the recording and reproducing characteristic suitable for high density recording, it is preferable to set the content of Pt in the magnetic layer 4b in the above range.

Similar to the magnetic particle 42 of the magnetic layer 4b, one or more types of elements selected from B, Ta, Mo, Cu, Nd, W, Nb, Sm, Tb, Ru or Re, in addition to Co, Cr and Pt, may be included in the magnetic particle 42 of the magnetic layer 4a. By including the element, it is possible to facilitate the miniaturization of the magnetic particle 42 or improve the crystallinity or orientation. Thus, it is possible to obtain the recording and reproducing characteristic and thermal fluctuation characteristic suitable for high density recording.

Further, the total content of the elements other than Co, Cr and Pt, included in the magnetic particle 42 of the magnetic layer 4b is preferably 8 at % or lower due to the same reason as in the magnetic particle 42 of the magnetic layer 4a.

As shown in FIG. 3, it is preferable that the magnetic layer 4c that forms the perpendicular magnetic layer 4 include the magnetic particle (crystal grain with magnetism) 42 including Co and Cr and do not include the oxide 41. It is preferable that the magnetic particle 42 in the magnetic layer 4c be epitaxially grown in a columnar shape from the magnetic particle 42 in the magnetic layer 4a. In this case, it is preferable that the magnetic particles 42 of the magnetic layers 4a, 4b and 4c be epitaxially grown in a columnar shape to match with each other one-to-one in the respective layers. Further, as the magnetic particle 42 of the magnetic layer 4b is epitaxially grown from the magnetic layer 42 in the magnetic layer 4a, the magnetic particle 42 of the magnetic layer 4c is miniaturized, and the crystallinity and orientation thereof is enhanced.

The content of Cr in the magnetic layer 4c is preferably 10 at % or higher and 24 at % or lower. By adjusting the content of Cr in the range, it is possible to sufficiently secure output in data reproduction, and to obtain an excellent thermal fluctuation characteristic. On the other hand, when the content of Cr exceeds the range, the magnetization of the magnetic layer 4c is reduced, which is not preferable. Further, when the Cr content is smaller than the range, the separation and miniaturization of the magnetic particle 42 are insufficient to increase noise in recording and reproducing, and a SNR suitable for high density recording cannot be obtained, which is not preferable.

Further, when the magnetic particle 42 that forms the magnetic layer 4c is a material containing Pt in addition to Co and Cr, the content of Pt in the magnetic layer 4c is preferably 8 at % or higher and 20 at % or lower. When the content of Pt is in the range, it is possible to obtain a sufficient coercive force suitable for high density recording, and to maintain a high reproduction output in recording and reproducing. Consequently, it is possible to obtain the recording and reproducing characteristic and the thermal fluctuation characteristic suitable for high density recording. On the other hand, if the content of Pt in the magnetic layer 4c exceeds the range, a layer of the fcc structure is formed in the magnetic layer 4c, and thus, the crystallinity and orientation thereof may deteriorate, which is not preferable. Further, if the content of Pt is smaller than the range, the magnetic anisotropic constant Ku necessary for the perpendicular magnetic layer 4 to obtain the thermal fluctuation characteristic suitable for high density recording cannot be obtained, which is not preferable.

The magnetic particle 42 that forms the magnetic layer 4c is a magnetic layer of a non-granular structure, and may include one or more types of elements selected from B, Ta, Mo, Cu, Nd, W, Nb, Sm, Tb, Ru, Re and Mn, in addition to Co, Cr and Pt. By including the element, it is possible to facilitate the miniaturization of the magnetic particle 42 or improve the crystallinity or orientation. Thus, it is possible to obtain the recording and reproducing characteristic and thermal fluctuation characteristic suitable for high density recording.

Further, the total content of the elements other than Co, Cr and Pt, included in the magnetic particle 42 of the magnetic layer 4c is preferably 16 at % or lower. If the total content of the elements exceeds 16 at %, a phase other than an hcp phase is formed in the magnetic particle 42. Thus, the crystallinity and orientation of the magnetic particle 42 deteriorate, and consequently, the recording and reproducing characteristic and the thermal fluctuation characteristic suitable for high density recording cannot be obtained, which is not preferable.

As a material suitable for the magnetic layer 4c, in particular, a CoCrPt based material or a CoCrPtB based material may be used. As the CoCrPtB based material, it is preferable that the total content of Cr and B be 18 at % or more and 28 at % or lower.

As the material suitable for the magnetic layer 4c, for example, in the CoCrPt based material, Co14 to 24Cr8 to 22Pt (Cr of 14 at % to 24 at %, Pt of 8 at % to 22 at % and residual Co) is preferable, and in the CoCrPtB based material, Co10 to 24Cr8 to 22Pt0 to 16B (Cr of 10 at % to 24 at %, Pt of 8 at % to 22 at %, B of 0 at % to 16 at % and residual Co) is preferable.

As a different material suitable for the magnetic layer 4c, in a CoCrPtTa based system, Co10 to 24Cr8 to 22Pt1 to 5Ta (Cr of 10 at % to 24 at %, Pt of 8 at % to 22 at %, Ta of 1 at % to 5 at % and residual Co) may be used, and in a CoCrPtTaB based material, Co10 to 24Cr8 to 22Pt1 to 5Ta1 to 10B (Cr of 10 at % to 24 at %, Pt of 8 at % to 22 at %, Ta of 1 at % to 5 at %, B of 1 at % to 10 at % and residual Co) may be used. In addition, a CoCrPtBNd based material, a CoCrPtTaNd based material, a CoCrPtNb based material, a CoCrPtBW based material, a CoCrPtMo based material, a CoCrPtCuRu based material, a CoCrPtRe based material or the like may be used.

[Protective Layer]

The protective layer 5 is formed on the perpendicular magnetic layer 4. The protective layer 5 is used for preventing corrosion of the perpendicular magnetic layer 4 and for preventing damage of the surface of the medium when the magnetic head is in contact with the magnetic recording medium. As the protective layer 5, a known material in the related art may be used, and for example, a material including C, $SiO_2$ or $ZrO_2$ may be used. It is preferable to adjust the thickness of the protective layer 5 to 1 nm to 10 nm in view of the high recording density since the distance between the magnetic head and the magnetic recording medium can be reduced.

[Lubricant Layer]

The lubricant layer 6 is formed on the protective layer 5. For example, a lubricant such as perfluoropolyether, fluorinated alcohol or fluorinated carboxylic acid may be preferably used as the lubricant layer 6.

(Manufacturing Method of Magnetic Recording Medium)

In order to manufacture the magnetic recording medium shown in FIG. 1, first, for example, an adhesive layer is formed on the non-magnetic substrate 1 using a sputtering method or the like. Then, the soft magnetic layer 2 is formed on the adhesive layer using a sputtering method or the like, for example. Thereafter, a sheet layer is formed on the soft magnetic layer 2 using a sputtering method or the like, for example. Finally, the orientation control layer 3 is formed on the sheet layer.

In the process of forming the orientation control layer 3, first, a sub process of forming a low gas pressure layer formed of Ru or a material in which Ru is used as a main component in the range of a sputtering gas pressure of 0.1 Pa to 3 Pa is performed. The sputtering gas pressure used in the sub process of forming the low gas pressure layer may be set in a range generally performed when the orientation control layer is formed using two-stage deposition.

In the present embodiment, since the sputtering gas pressure when the low gas pressure layer 3a is formed is in the range of 0.1 Pa to 3 Pa, the effect of miniaturizing the magnetic particle 42 that forms the perpendicular magnetic layer 4 can be sufficiently obtained, to thereby obtain a sufficiently high hardness.

If the sputtering gas pressure of the low gas pressure layer 3a is smaller than the range, the orientation of the low gas pressure layer 3a may deteriorate, and the effect of miniaturizing the magnetic particle 42 that forms the perpendicular magnetic layer 4 may be insufficient. Further, if the sputtering gas pressure of the low gas pressure layer 3a exceeds the range, the crystallinity of the low gas pressure layer 3a is decreased, and the hardness of the low gas pressure layer 3a is reduced, which reduces the reliability of the magnetic recording medium.

As a sputtering gas used when the low gas pressure layer 3a is deposited using the sputtering method, one or more types of Ar, Kr and Xe may be preferably used. When two or more types of gases selected from Ar, Kr and Xe are used as the sputtering gas used when the low gas pressure layer 3a is deposited, for example, a sputtering gas that contains Kr of 40 vol. % or more and Xe of 30 vol. % or more with respect to Ar may be used.

Kr and Xe have ionization potentials lower than Ar, and thus are easily ionized at low gas pressure. Further, Kr and Xe have large atomic weights, and thus can form high-energy sputtered particles. Further, Xe can easily form the high-energy sputtered particles compared with Kr. Accordingly, when two or more types of gases are selected from Ar, Kr and Xe as the sputtering gas, it is preferable that Kr or Xe be included in the sputtering gas as much as possible, and it is more preferable that Xe of 100% be included therein.

Then, a sub process of forming the high gas pressure layer 3b (granular layer) having the granular structure that includes an oxide having a melting point of 1000° C. or lower, such as $Ba_2O_3$, and is formed of Ru or a material in which Ru is used as a main component on the low gas pressure layer 3a by the sputtering method is performed.

In the sub process of forming the high gas pressure layer 3b is preferably performed at a sputtering pressure of 3 Pa to 6 Pa that is higher than that in the process of forming the low gas pressure layer 3a. When the sub process of forming the low gas pressure layer 3a is performed at a sputtering pressure of 3 Pa, the process of forming the high gas pressure layer 3b is performed at a sputtering pressure that exceeds 3 Pa.

As a sputtering gas used when the high gas pressure layer 3b is deposited by the sputtering method, the same sputtering gas as the sputtering gas used when the low gas pressure layer 3a is deposited by the sputtering method may be used.

In the present embodiment, the high gas pressure layer 3b has the granular structure that includes the oxide having the melting point of 1000° C. or lower and is formed of Ru or the material in which Ru is used as a main component. Thus, the oxide having the melting point of 1000° C. or lower included in the high gas pressure layer 3b easily surrounds the periphery of Ru. Thus, it is possible to easily obtain a segregation structure of the particle that is formed of Ru or in which Ru is used as a main component. Accordingly, in the present embodiment, even though a low sputtering gas pressure in the range of 6 Pa or less is used, it is possible to form the high gas pressure layer 3b in which crystal grains are sufficiently separated, and to form the high gas pressure layer 3b capable of miniaturizing the magnetic particles of the columnar structure of the perpendicular magnetic layer 4 grown thereon.

Accordingly, in the present embodiment, it is possible to suppress degradation of the hardness of the high gas pressure layer 3b due to a high sputtering gas pressure, thereby improving the reliability of the magnetic recording medium.

Further, in the present embodiment, since it is possible to adjust the sputtering gas pressure when the high gas pressure layer 3b is formed in the low range of 6 Pa or less, it is possible to reduce the surface roughness of the growth surface of the high gas pressure layer 3b. Consequently, it is possible to obtain a magnetic recording medium having a smooth surface in which the surface roughness (Ra) measured by the AFM is 3 angstroms or less, thereby obtaining a stable floating travel of the magnetic head and improving the electromagnetic exchange characteristic.

If the sputtering gas pressure of the high gas pressure layer 3b exceeds the range, the magnetostatic characteristic may deteriorate due to deterioration of the orientation of the orientation control layer 3, the hardness of the high gas pressure layer 3b may be insufficient, and the excellent thermal fluctuation characteristic may not be obtained.

When the sputtering gas pressure of the high gas pressure layer 3b is smaller than that in the process of forming the low gas pressure layer 3a, the effect of increasing the orientation of the high gas pressure layer 3b by forming the low gas pressure layer 3a before the formation of the high gas pressure layer 3b may be insufficient.

Then, the non-magnetic underlayer 8 is formed on the high gas pressure layer 3b. The non-magnetic underlayer 8 is preferably formed using a sputtering method. Thus, the non-magnetic underlayer 8 can be easily epitaxially grown on the high gas pressure layer 3b of the orientation control layer 3 as a columnar crystal continuous to the columnar crystals of the low gas pressure layer 3a and the high gas pressure layer 3b of the orientation control layer 3.

Then, the perpendicular magnetic layer 4 in which an easy axis of magnetization is mainly perpendicularly orientated to the non-magnetic substrate 1 is formed on the non-magnetic underlayer 8. The process of forming the perpendicular magnetic layer 4 is a process of crystal-growing the crystal grain to form a columnar crystal continuous to the crystal grain that forms the orientation control layer 3 in the thickness direction. The perpendicular layer 4 (the magnetic layers 4a to 4c and the non-magnetic layers 7a and 7b) is preferably used using a sputtering method. Thus, the perpendicular magnetic layer 4 can be easily epitaxially grown on the non-magnetic underlayer 8 as a columnar crystal continuous to the columnar crystals of the low gas pressure layer 3a and the high gas pressure layer 3b of the orientation control layer 3.

The protective layer 5 may be formed using a chemical vapor deposition (CVD) method or the like, for example.

The lubricant layer 6 may be formed using a dipping method or the like, for example.

In the present embodiment, the example in which the low gas pressure layer 3a is formed before the process of forming the high gas pressure layer 3b of the orientation control layer 3 has been described, but the orientation control layer 3 may not include the low gas pressure layer 3a, and thus, the low gas pressure layer 3a may not be formed.

(Magnetic Recording and Reproducing Apparatus)

Figure 4:
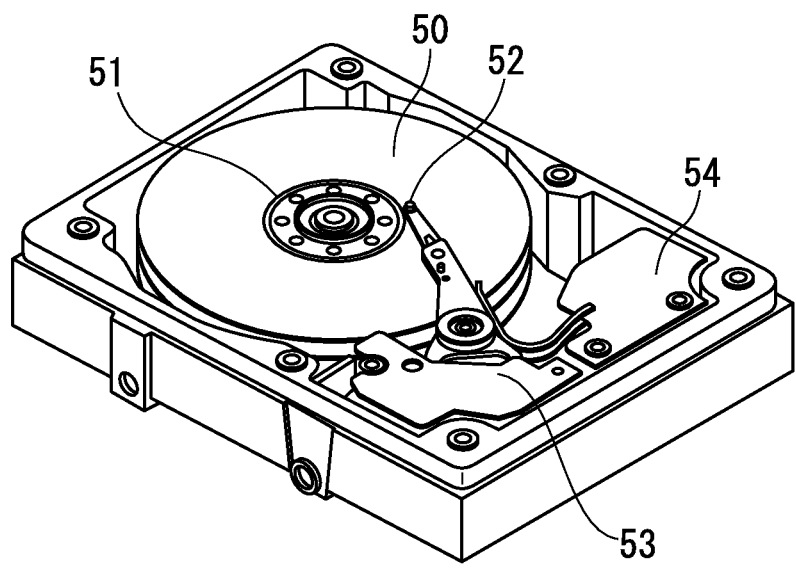
FIG. 4 is a diagram illustrating an example of a magnetic recording and reproducing apparatus to which an embodiment of the invention is applied.

FIG. 4 is a diagram illustrating an example of the magnetic recording and reproducing apparatus to which an embodiment of the invention is applied.

The magnetic recording and reproducing apparatus includes a magnetic recording medium 50, as shown in FIG. 1, manufactured by the above-described manufacturing method, a medium driving unit 51 that rotationally drives the magnetic recording medium 50, a magnetic head 52 that performs recording and reproducing of information on the magnetic recording medium 50, a head driving unit 53 that relatively moves the magnetic head 52 with respect to the magnetic recording medium 50, and a recording and reproducing signal processing system 54.

The recording and reproducing signal processing system 54 processes data input from the outside to transmit a recording signal to the magnetic head 52, and processes a reproduced signal from the magnetic head 52 to transmit data to the outside. As the magnetic head 52, a magnetic head suitable for higher recording density, which has a grand magnetic resistance (GMR) element that uses GMR as a reproducing element or the like may be used.

The magnetic recording and reproducing apparatus shown in FIG. 4 includes the magnetic recording medium 50 as shown in FIG. 1, manufactured by the magnetic recording medium manufacturing method of the present embodiment, and the magnetic head 52 that performs recording and reproducing of information for the magnetic recording medium 50. Thus, it is possible to achieve the magnetic recording medium 50 with high reliability, capable of achieving higher recording density.

EXAMPLES

Hereinafter, the effects of the invention will be more apparently described through the following examples. The invention is not limited to the following examples, and various modifications may be approximately made in a range without departing from the spirit of the invention.

Examples 1 to 25 and Comparative Examples 1 to 15

Magnetic recording mediums of Examples 1 to 25 and Comparative Examples 1 to 15 were manufactured using the following manufacturing method, and were evaluated.

First, a washed glass substrate (made by Konica Minolta, having a size of 2.5 inches) was accommodated in a deposition chamber of a DC magnetron sputtering apparatus (made by Canon Anelva Corporation, C-3040), and the inside of the deposition chamber was discharged until it reaches the degree of vacuum $1 \times 10^{-5}$ Pa.

Then, an adhesive layer having a thickness of 10 nm was deposited on the glass substrate using a target of Cr by a sputtering method (gas pressure of 0.8 Pa (Ar was used as a sputtering gas in Examples 1 to 25 and Comparative Examples 1 to 15)).

Then, a soft magnetic layer having a thickness of 25 nm was deposited on the adhesive layer using a target of Co-20Fe-5Zr-5Ta (Fe of 20 at %, Zr of 5 at %, Ta of 5 at % and residual Co) at a substrate temperature of 100° C. or lower using a sputtering method (gas pressure of 0.8 Pa), an Ru layer was deposited thereon at a thickness of 0.7 nm, and a soft magnetic layer having the thickness of 25 nm formed of Co-20Fe-5Zr-5Ta was deposited thereon, to thereby form the soft magnetic underlayer.

Subsequently, a film formed of Ni5W having a thickness of 10 nm was deposited as a sheet layer on the soft magnetic underlayer by a sputtering method (gas pressure of 0.8 Pa).

Then, a low gas pressure layer and a high gas pressure layer were formed on the sheet layer as an orientation control layer.

First, Ru having a thickness of 10 nm was deposited on the sheet layer as the low gas pressure layer using a sputtering method (gas pressure of 0.8 Pa).

Then, the high gas pressure layer having a thickness of 10 nm was deposited on the low gas pressure layer using a material and a gas pressure shown in Table 2 by a sputtering method.

Thereafter, a perpendicular magnetic layer was formed on the orientation control layer.

First, a lower magnetic layer having a granular structure of composition of $(Co15Cr16Pt)91-(SiO_2)6-(TiO_2)3$ (in which an alloy of Cr of 15 at %, Pt of 16 at % and residual Co was 91 mol %, an oxide formed of $SiO_2$ was 6 mol %, and an oxide formed of $TiO_2$ was 3 mol %} was deposited on the high pressure layer of the orientation control layer to have a thickness of 9 nm at a sputtering gas pressure of 2 Pa.

Then, a non-magnetic layer of a thickness of 0.3 nm made of $(Co30Cr)88-(TiO_2)12$ was deposited on the magnetic layer.

Thereafter, an intermediate magnetic layer of a thickness of 6 nm having a granular structure, made of $(Co11Cr18Pt)92-(SiO_2)5-(TiO_2)3$, was deposited at a sputtering gas pressure of 2 Pa.

Then, a non-magnetic layer having a thickness of 0.3 made of Ru was deposited on the magnetic layer.

Then, an upper magnetic layer having a thickness of 7 nm was deposited on the non-magnetic layer at a sputtering gas pressure of 0.6 Pa, using a target formed of Co20Cr14Pt3B (Cr of 20 at %, Pt of 14 at %, B of 3 at % and residual Co).

Then, a protective layer formed of C with a thickness of 3.0 nm was deposited by a CVD method, and a lubricant layer having a thickness of 2 nm formed of perfluoropolyether was deposited by a dipping method, to thereby manufacture the magnetic recording mediums of Examples 1 to 25 and Comparative Examples 1 to 15.

The size of crystal grains of the intermediate magnetic layer having the granular structure was measured with respect to the magnetic recording mediums of Examples 1 to 25 and Comparative Examples 1 to 15 manufactured as described above. Specifically, with respect to the magnetic recording mediums of Examples 1 to 25 and Comparative Examples 1 to 15, the intermediate magnetic layer of the granular structure formed of $(Co11Cr18Pt)92-(SiO_2)5-(TiO_2)3$ was formed, the substrate was extracted from the sputtering apparatus, and then, an average size of magnetically coupled crystal grains in the intermediate magnetic layer of the granular structure was measured by sectional TEM observation.

The results are shown in Table 2.

Further, with respect to the magnetic recording mediums of Examples 1 to 25 and Comparative Examples 1 to 15, evaluation of the SNR was performed as recording and reproducing characteristics, using a read/write analyzer RWA 1632 and a spin stand S1701 MP made by Guzik Technical Enterprises.

As a magnetic head, a head that uses a single magnetic pole on a write side and uses a TMR element on a read side was used. The SNR was measured as a recording density of 750 KFCI. With respect to a recording characteristic (OW), a signal of 750 kFCI was written, a signal of 100 kFCI was overwritten, and then, a high frequency component was extracted by a frequency filter. Then, a data writing ability was evaluated by a residual ratio thereof.

The results of the magnetic recording mediums of Examples 1 to 25 and Comparative Examples 1 to 15 are shown in Table 2.

Further, with respect to the magnetic recording mediums of Examples 1 to 25 and Comparative Examples 1 to 15, the surface roughness was measured by an atomic force microscope (AFM). The measurement results are shown in Table 2.

Further, with respect to the magnetic recording mediums of Examples 1 to 25 and Comparative Examples 1 to 15, as an evaluation of the hardness of the film that forms the orientation control layer, scratch resistance of the magnetic recording mediums was evaluated. Specifically, using an SAF tester made by Kubota Comps Corporation and an optical surface inspection apparatus (OSA) made by CANDELA corporation, the head was loaded and retained for 2000 seconds in the SAF tester under the conditions of a disk revolution of 5000 rpm, an atmospheric pressure of 100 Torr and a room temperature, and then, the number of scratches was counted by the OSA. The results are shown in Table 2.

As shown in Table 2, in Examples 1 to 5 in which the high gas pressure layer is a granular layer having a granular structure that includes Ru, or a material in which Ru is used as a main component and $B_2O_3$ that is an oxide having a melting point of 1000° C. or lower, when the sputtering gas pressure of the high gas pressure layer is 3 Pa to 10 Pa, the average size of the magnetically coupled crystal grains is 27.5 nm or lower, which shows sufficient miniaturization. Particularly, in Examples 1 to 5, compared with Compara-

TABLE 2

| | HIGH GAS PRESSURE LAYER | | CRYSTAL GRAIN DIAMETER OF | SNR OF | | |
|---|---|---|---|---|---|---|
| | MATERIAL (vol. %) | GAS PRESSURE (Pa) | GRANULAR MAGNETIC LAYER (nm) | MAGNETIC RECORDING MEDIUM (dB) | SURFACE ROUGHNESS (Ra) (Å) | NUMBER OF SCRATCH |
| EXAMPLE 1 | 90Ru—10$B_2O_3$ | 3 | 27.5 | 17.6 | 2.85 | 50 |
| EXAMPLE 2 | 90Ru—10$B_2O_3$ | 4 | 27.0 | 17.8 | 2.90 | 100 |
| EXAMPLE 3 | 90Ru—10$B_2O_3$ | 6 | 27.0 | 17.7 | 2.90 | 100 |
| EXAMPLE 4 | 90Ru—10$B_2O_3$ | 8 | 27.2 | 17.7 | 2.90 | 150 |
| EXAMPLE 5 | 90Ru—10$B_2O_3$ | 10 | 27.3 | 17.7 | 2.95 | 200 |
| EXAMPLE 6 | 90Ru—10$In_2O_3$ | 3 | 27.8 | 17.6 | 2.90 | 120 |
| EXAMPLE 7 | 90Ru—10$In_2O_3$ | 4 | 27.5 | 17.6 | 2.90 | 150 |
| EXAMPLE 8 | 90Ru—10$In_2O_3$ | 6 | 27.6 | 17.7 | 2.95 | 200 |
| EXAMPLE 9 | 90Ru—10$In_2O_3$ | 8 | 27.6 | 17.8 | 3.00 | 250 |
| EXAMPLE 10 | 90Ru—10$In_2O_3$ | 10 | 27.5 | 17.7 | 3.00 | 250 |
| EXAMPLE 11 | 87(90Ru10Cr)—13$B_2O_3$ | 3 | 27.1 | 17.8 | 2.85 | 70 |
| EXAMPLE 12 | 87(90Ru10Cr)—13$B_2O_3$ | 4 | 27.2 | 17.6 | 2.85 | 100 |
| EXAMPLE 13 | 87(90Ru10Cr)—13$B_2O_3$ | 6 | 27.1 | 17.7 | 2.85 | 120 |
| EXAMPLE 14 | 87(90Ru10Cr)—13$B_2O_3$ | 8 | 27.4 | 17.8 | 2.90 | 150 |
| EXAMPLE 15 | 87(90Ru10Cr)—13$B_2O_3$ | 10 | 27.3 | 17.7 | 2.90 | 200 |
| EXAMPLE 16 | 90Ru—10$Sb_2O_3$ | 3 | 27.6 | 17.6 | 2.85 | 100 |
| EXAMPLE 17 | 90Ru—10$Sb_2O_3$ | 4 | 27.4 | 17.6 | 2.85 | 110 |
| EXAMPLE 18 | 90Ru—10$Sb_2O_3$ | 6 | 27.3 | 17.6 | 2.90 | 130 |
| EXAMPLE 19 | 90Ru—10$Sb_2O_3$ | 8 | 27.4 | 17.7 | 2.90 | 170 |
| EXAMPLE 20 | 90Ru—10$Sb_2O_3$ | 10 | 27.3 | 17.7 | 2.95 | 210 |
| EXAMPLE 21 | 90Ru—10$TeO_2$ | 3 | 27.7 | 17.6 | 2.85 | 100 |
| EXAMPLE 22 | 90Ru—10$TeO_2$ | 4 | 27.3 | 17.5 | 2.90 | 130 |
| EXAMPLE 23 | 90Ru—10$TeO_2$ | 6 | 27.5 | 17.6 | 2.90 | 150 |
| EXAMPLE 24 | 90Ru—10$TeO_2$ | 8 | 27.5 | 17.7 | 2.95 | 200 |
| EXAMPLE 25 | 90Ru—10$TeO_2$ | 10 | 27.4 | 17.7 | 3.00 | 230 |
| COMPARATIVE EXAMPLE 1 | Ru | 3 | 36.0 | 14.6 | 3.10 | 400 |
| COMPARATIVE EXAMPLE 2 | Ru | 4 | 33.0 | 15.0 | 3.15 | 400 |
| COMPARATIVE EXAMPLE 3 | Ru | 6 | 28.5 | 17.2 | 3.15 | 450 |
| COMPARATIVE EXAMPLE 4 | Ru | 8 | 27.5 | 17.4 | 3.15 | 450 |
| COMPARATIVE EXAMPLE 5 | Ru | 10 | 27.4 | 17.5 | 3.15 | 500 |
| COMPARATIVE EXAMPLE 6 | 90Ru—10$Cr_2O_3$ | 3 | 29.0 | 16.9 | 3.10 | 300 |
| COMPARATIVE EXAMPLE 7 | 90Ru—10$Cr_2O_3$ | 4 | 28.4 | 17.3 | 3.15 | 300 |
| COMPARATIVE EXAMPLE 8 | 90Ru—10$Cr_2O_3$ | 6 | 28.0 | 17.4 | 3.10 | 300 |
| COMPARATIVE EXAMPLE 9 | 90Ru—10$Cr_2O_3$ | 8 | 27.9 | 17.4 | 3.10 | 300 |
| COMPARATIVE EXAMPLE 10 | 90Ru—10$Cr_2O_3$ | 10 | 28.4 | 17.5 | 3.10 | 300 |
| COMPARATIVE EXAMPLE 11 | 90Ru—10$TiO_2$ | 3 | 28.0 | 17.2 | 3.10 | 300 |
| COMPARATIVE EXAMPLE 12 | 90Ru—10$TiO_2$ | 4 | 28.2 | 17.4 | 3.15 | 300 |
| COMPARATIVE EXAMPLE 13 | 90Ru—10$TiO_2$ | 6 | 28.0 | 17.4 | 3.15 | 350 |
| COMPARATIVE EXAMPLE 14 | 90Ru—10$TiO_2$ | 8 | 27.9 | 17.4 | 3.15 | 350 |
| COMPARATIVE EXAMPLE 15 | 90Ru—10$TiO_2$ | 10 | 27.9 | 17.5 | 3.15 | 350 | tive Examples 1 to 5 that do not include an oxide when the sputtering gas pressure of the high gas pressure layer is 6 Pa or lower, Comparative Examples 6 to 10 that includes $Cr_2O_3$ that is an oxide having a melting point that exceeds 1000° C., and Comparative Examples 11 to 15 that include $TiO_2$ that is an oxide having a melting point that exceeds 1000° C., the average size of the magnetically coupled crystal grains is small.

Further, in Examples 6 to 10 in which the high gas pressure layer is a granular layer having a granular structure that includes Ru or a material in which Ru is used as a main component and $In_2O_3$ that is an oxide having a melting point of 1000° C. or lower, and Examples 11 to 15 in which the high gas pressure layer is a granular layer having a granular structure that includes a material in which Ru is used as a main component and Cr of 10 vol. % is included and $B_2O_3$ of 13 vol. % that is an oxide having a melting point of 450° C. to 1000° C., similarly, when the sputtering gas pressure of the high gas pressure layer is 6 Pa or lower, the average size of the magnetically coupled crystal grains is small, compared with the comparative examples.

Further, as shown in Table 2, in Examples 1 to 25, a sufficiently large SNR was obtained, and change in the SNR when the sputtering gas pressure of the high gas pressure layer is reduced was small, compared with Comparative Examples 1 to 15. Further, even when the sputtering gas pressure of the high gas pressure layer was 6 Pa or lower, the SNR was 17.5 dB or higher.

Further, as shown in Table 2, in Examples 1 to 25, the number of scratches was small and the hardness was high, compared with Comparative Examples 1 to 15.

Further, as shown in Table 2, in Examples 1 to 25, the surface roughness (Ra) obtained by measuring the surface using the AFM was 3 angstroms or lower, which was small, compared with Comparative Examples 1 to 15.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended Claims.

What is claimed is:

1. A method of manufacturing a magnetic recording medium, comprising at least:
    forming an orientation control layer that controls orientation of an immediately above layer thereof on a non-magnetic substrate; and
    forming a perpendicular magnetic layer in which an easy axis of magnetization is mainly perpendicularly orientated to the non-magnetic substrate, in this order from the non-magnetic substrate side,
    wherein the forming of the orientation control layer includes:
        forming a low gas pressure layer formed of Ru or a material in which R is a main component and not including oxide, and
        forming a high gas pressure layer having a granular structure that includes Ru or a material in which Ru is a main component and at least one oxide of $B_2O_3$, $In_2O_3$, $Sb_2O_3$, $TeO_2$, by a sputtering method, in this order from the non-magnetic substrate side, and
    wherein the forming of the perpendicular magnetic layer includes growing crystal grains to form columnar crystals that are continuous in a thickness direction together with crystal grains that form the orientation control layer.

2. The method of manufacturing the magnetic recording medium according to claim 1,
    wherein the oxide included in the granular structure is either of $B_2O_3$ or $In_2O_3$.

3. The method of manufacturing the magnetic recording medium according to claim 1,
    wherein the forming of the high pressure layer is performed at a sputtering gas pressure which is greater than or equal to 3 Pa and less than or equal to 6 Pa.

4. The method of manufacturing the magnetic recording medium according to claim 1,
    wherein the low gas pressure layer is formed in a sputtering gas pressure which is in the range of 0.1 Pa to 3 Pa by a sputtering method, before the forming of the high gas pressure layer, and
    wherein the forming of the high gas pressure layer is performed at a sputtering pressure higher than that in the forming of the low gas pressure layer.

5. The method of manufacturing the magnetic recording medium according to claim 1,
    wherein the high gas pressure layer includes the oxide included in the granular structure in a range of 2 vol. % to 20 vol. % in total.

6. The method of manufacturing the magnetic recording medium according to claim 1,
    wherein in the forming of the perpendicular magnetic layer, the perpendicular magnetic layer is formed by the sputtering method.

7. The method of manufacturing the magnetic recording medium according to claim 1,
    wherein the oxide included in the granular structure is $B_2O_3$.

8. The method of manufacturing the magnetic recording medium according to claim 1, wherein an NiW alloy is used as a material to form a seed layer to control the size of crystal grains of the orientation control layer.

9. The method of manufacturing the magnetic recording medium according to claim 1,
    wherein the low gas pressure is formed of Ru, and the high gas pressure layer is formed of Ru and $B_2O_3$.

* * * * *